(12) United States Patent
Mori

(10) Patent No.: US 11,047,749 B2
(45) Date of Patent: Jun. 29, 2021

(54) ELECTRONIC DEVICE

(71) Applicant: Murata Manufacturing Co., Ltd., Nagaokakyo (JP)

(72) Inventor: Kenichi Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 121 days.

(21) Appl. No.: 16/594,632

(22) Filed: Oct. 7, 2019

(65) Prior Publication Data

US 2020/0033205 A1 Jan. 30, 2020

Related U.S. Application Data

(63) Continuation of application No. PCT/JP2018/026461, filed on Jul. 13, 2018.

(30) Foreign Application Priority Data

Jul. 26, 2017 (JP) .............................. JP2017-144168

(51) Int. Cl.
*G01L 1/16* (2006.01)
*G06F 3/041* (2006.01)
*G06F 3/044* (2006.01)

(52) U.S. Cl.
CPC ................ *G01L 1/16* (2013.01); *G06F 3/044* (2013.01); *G06F 3/0416* (2013.01)

(58) Field of Classification Search
CPC ....... G06F 1/1652; G06F 3/044; G06F 3/0416
USPC .................................................... 73/862.625
See application file for complete search history.

(56) References Cited

U.S. PATENT DOCUMENTS

| 3,559,467 A * | 2/1971 | Gurol ........................ G01L 1/04 |
| | | 73/782 |
| 4,471,258 A * | 9/1984 | Kumada ................ H04R 17/00 |
| | | 310/345 |
| 10,292,273 B2 * | 5/2019 | Kouchi ................... H05K 1/189 |
| 10,861,908 B2 * | 12/2020 | Seomoon .............. H01L 27/323 |
| 10,959,025 B2 * | 3/2021 | Lee ........................ H01L 41/083 |

(Continued)

FOREIGN PATENT DOCUMENTS

| JP | 2014006892 A | 1/2014 |
| WO | 2014010329 A1 | 1/2014 |
| WO | 2016043215 A1 | 3/2016 |

OTHER PUBLICATIONS

International Search Report issued for PCT/JP2018/026461, dated Aug. 7, 2018.

*Primary Examiner* — Octavia Hollington
(74) *Attorney, Agent, or Firm* — Arent Fox LLP

(57) ABSTRACT

An electronic device is provided that includes a flexible body, a stress sensor, and a detector. The stress sensor has a piezoelectric film that is deformed by a stress resulting from bending of the body. The stress sensor detects stresses that develop respectively at an end part and a central part of the body. When the end part and the central part are bent at the same radius of curvature, the stress sensor outputs output values such that a first output value based on a stress having developed at the end part is different from a second output value based on a stress having developed at the central part. Moreover, the detector detects at least one of the first output value and the second output value having exceeded a given threshold.

20 Claims, 7 Drawing Sheets

(56) References Cited

U.S. PATENT DOCUMENTS

| | | |
|---|---|---|
| 2004/0084986 A1* | 5/2004 | Arbogast ............ H01L 41/0973 |
| | | 310/163 |
| 2013/0321373 A1 | 12/2013 | Yoshizumi |
| 2014/0055394 A1* | 2/2014 | Park ........................ G06F 3/016 |
| | | 345/173 |
| 2015/0138737 A1 | 5/2015 | Yukawa |
| 2015/0187325 A1* | 7/2015 | Yeo ........................ G09F 9/301 |
| | | 345/156 |
| 2017/0294151 A1 | 10/2017 | Arai |

* cited by examiner

ELECTRONIC DEVICE

CROSS REFERENCE TO RELATED APPLICATIONS

The present application is a continuation of PCT/JP2018/026461 filed Jul. 13, 2018, which claims priority to Japanese Patent Application No. 2017-144168, filed Jul. 26, 2017, the entire contents of each of which are incorporated herein by reference.

TECHNICAL FIELD

The present invention relates to a flexible electronic device and particularly relates to an electronic device that detects a stress.

BACKGROUND

A conventional electronic device having a flexible display surface is known, for example, as described in Patent Document 1 (identified below). The electronic device described in Patent Document 1 is flexible at least on a part thereof. Its display surface, therefore, can be bent or twisted. For example, electronic device of Patent Document 1 can be bent in such a way as to make the display surface concave along a direction perpendicular to the long sides of the device. The electronic device of Patent Document 1 can also be bent in such a way as to make the display surface convex.

Patent Document 1: Japanese Patent Application Laid-Open No. 2014-006892.

Such an electronic device as described in Patent Document 1, however, may have circuit components or the like grouped together at its end part in long sides. In this case, if a user bends the end part with a force equal in magnitude to a force with which a central part is bent, it may cause the electronic device to make an unexpected action. As a result, the reliability of the electronic device, which ensures its stable operation at the time of stress application, drops.

SUMMARY OF THE INVENTION

Accordingly, an object of an exemplary embodiment of the present invention is to provide an electronic device that is improved to exert high reliability when being subjected a stress.

Thus, an electronic device according to one exemplary embodiment includes a flexible body; and a sensor disposed in the body and having a piezoelectric film that is deformed by a stress resulting from bending of the body. In this aspect, the sensor is configured to detect stresses having developed respectively at an end part and a central part of the body in a lengthwise direction perpendicular to a thickness direction of the body and, when the end part and the central part are bent at the same radius of curvature, to generate a first output value based on a stress having developed at the end part different from a second output value based on a stress having developed at the central part. In addition, the electronic device includes a detector that detects at least one of the first output value and the second output value having exceeded a given threshold.

In this configuration, when the end part and the central part of the body are bent at the same radius of curvature, different output values can be obtained respectively at the end part and the central part of the body. The electronic device of the present invention, therefore, provides improved reliability even when the central part and the end part are bent at the same radius of curvature.

It is preferable, according to the electronic device of the one embodiment, that the sensor is configured to output the first output value and the second output value in such a way as to make the first output value larger than the second output value when the end part and the central part are bent at the same radius of curvature.

In this configuration, even when the central part and the end part are bent at the same radius of curvature, the first output value becomes larger than the second output value. As a result, sensitivity at the end part becomes higher than sensitivity at the central part.

It is preferable, according to the electronic device of the one embodiment, that the sensor has an electrode disposed on a surface of the piezoelectric film with the electrode composed of a first electrode disposed on the end part and a second electrode disposed on the central part, and that the area of the first electrode is different from the area of the second electrode.

In this configuration, the first output value is different from the second output value because of the difference between the area of the first electrode and the area of the second electrode.

It is preferable, according to the electronic device of the one embodiment, that the electronic device further includes an adhesive layer, that the body has a cover covering the sensor, that the adhesive layer is disposed between the sensor and the cover, and that an elastic modulus of a first adhesive used as the adhesive layer on the end part is different from an elastic modulus of a second adhesive used as the adhesive layer on the central part.

In this configuration, the first output value is different from the second output value because of the difference between the elastic modulus of the first adhesive and the elastic modulus of the second adhesive.

It is preferable, according to the electronic device of the one embodiment, that the piezoelectric film contains polylactic acid and is formed such that an angle of the direction of drawing of the piezoelectric film against the lengthwise direction of the body at the end part is different from an angle of the direction of drawing of the piezoelectric film against the lengthwise direction of the body at the central part.

In this configuration, the first output value is different from the second output value because of the difference between the direction of drawing at the end part and the direction of drawing at the central part.

It is preferable, according to the electronic device of the one embodiment, that the piezoelectric film has a plurality of slits elongated in a direction parallel with the lengthwise direction of the body. Moreover, the slits are formed on the end part such that they are lined up in a widthwise direction perpendicular to the thickness direction of the body and to the lengthwise direction of the body.

In this configuration, the first output value is different from the second output value because of the slits formed on the end part.

It is preferable that the electronic device of the one embodiment includes an informing unit that, when the detector detects one of the first output value or the second output value having exceeded the threshold, gives a notification about the first output value or the second output value having exceeded the threshold.

In this configuration, a user is readily informed by the informing unit of one of the first output value or the second output value having exceeded the threshold.

It is preferable that the electronic device of the one embodiment includes a control unit that controls the detector. It is preferable that the threshold be provided as a plurality of thresholds. It is preferable that the plurality of thresholds include a first threshold and a second threshold higher than the first threshold. It is preferable that when the detector detects the first output value having exceeded the first threshold, the control unit cause the informing unit to give a notification about the first output value having exceeded the first threshold, and that when the detector detects the first output value having exceeded the second threshold, the control unit cut off power supply to the body.

In this configuration, the control unit carries out a step-by-step process, thereby ensures the safety of the electronic device and improves the reliability of the same as well.

It is preferable, according to the electronic device of the one embodiment, that the sensor has a detecting electrode of a planar shape that is disposed on a first surface of the piezoelectric film, and a reference electrode of a planar shape that is disposed on a surface of the piezoelectric film that is opposite to the first surface.

In this configuration, a stress can be detected on a plane. This further improves the reliability of the electronic device.

It is preferable, according to the electronic device of the one embodiment, that one wiring electrode is connected to the detecting electrode and to the reference electrode. It is preferable that the wiring electrode be electrically connected to the detector.

In this configuration, the number of wiring lines can be reduced and therefore a simpler structure can be achieved.

According to the exemplary embodiments of the present invention, an electronic device is provided that is improved to exert high reliability when being subjected to a stress.

DETAILED DESCRIPTION

Figure 1:
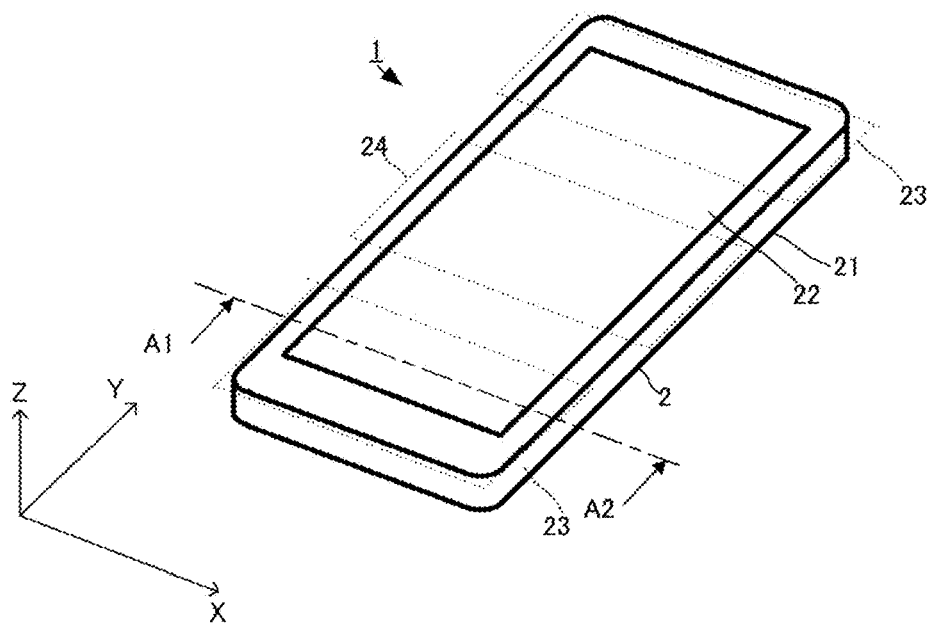
FIG. 1 is an external perspective view of an electronic device according to a first embodiment.

Electronic devices 1, 1A, 1B, and 1C according to embodiments of the present invention will be described with reference to drawings. FIG. 1 is an external perspective view of an electronic device 1. As shown in FIG. 1, the electronic device 1 is a portable information terminal, such as a smart phone, for example.

Accordingly, the electronic device 1 is configured to download an application program through the Internet. By operating application programs, a user causes the electronic device 1 to exert various functions. An X direction, a Y direction, and a Z direction shown in FIG. 1 represent directions defined respectively for the electronic device 1 (i.e., body 2). Each of the drawings is a diagrammatical view, and therefore the dimensions, shape, or the like of a constituent element are not strictly depicted in each drawing.

First Exemplary Embodiment

Figure 2:
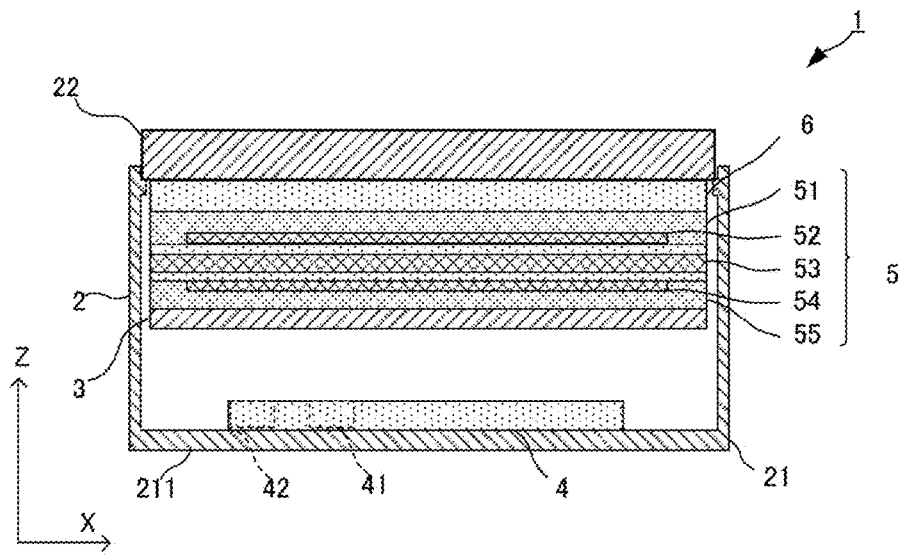
FIG. 2 is a sectional view of the above electronic device that is taken along an A1-A2 line.
Figure 3:
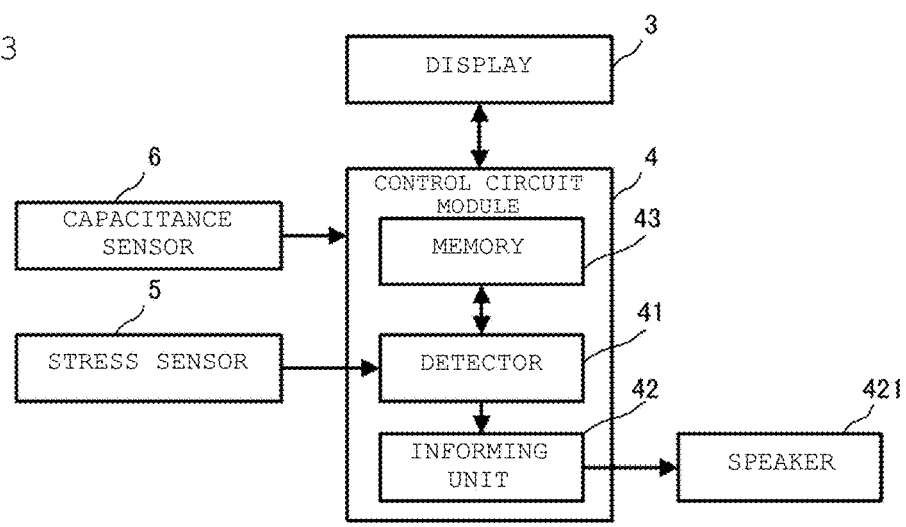
FIG. 3 is a block diagram showing a configuration of the above electronic device.

The electronic device 1 according to a first embodiment will be described with reference to FIGS. 1 to 6. FIG. 2 is a sectional view of the electronic device 1 that is taken along an A1-A2 line. FIG. 3 is a block diagram showing a configuration of the electronic device 1.

As shown in FIG. 2, the electronic device 1 includes a body 2, a display 3, a control circuit module (e.g., a control unit) 4, a stress sensor 5 (e.g., a sensor), and a capacitance sensor 6. The electronic device 1 further includes a speaker 421 as shown in FIG. 3.

According to the exemplary embodiment, the body 2 is flexible. As shown in FIG. 1, the body 2 is formed on the assumption that the user bends the body 2 around the X direction. The body 2 has a housing 21 and a cover panel 22.

In an exemplary aspect, the housing 21 is made of a resin or the like. The housing 21 is formed into a parallelepiped box shape having an opening on its one face. In other words, the housing 21 is of a rectangular shape in a plan view. The housing 21 is formed such that its thickness is shorter than its length and width, that is, housing 21 is thin-walled.

The cover panel 22 is made of a material having flexibility and translucency, such as polyethylene terephthalate (PET), polycarbonate (PC), or acryl. The cover panel 22 is formed into a rectangular, tabular shape. The cover panel 22 is disposed in such a way as to cover the opening of the housing 21. The cover panel 22 functions as a touch surface on which the user touches the surface with a finger or a pen.

As shown in FIG. 1, according to the electronic device 1 of this embodiment, the width direction of the body (i.e., housing 21) is defined as the X direction, the lengthwise direction of the same as the Y direction, and the thickness direction of the same as the Z direction for purposes of describing the present disclosure.

The display 3 is, for example, a liquid crystal display ("LCD"). The display 3 is formed into a rectangular, tabular shape. As shown in FIG. 2, the display 3 is placed in the body 2. The display 3 displays a software application and the like downloaded by the user.

Inside the body 2, the control circuit module 4 is disposed on a bottom wall 211 of the housing 21. The control circuit module 4 is disposed on at least one of a pair of end parts 23 in the lengthwise direction of the body 2, the end parts 23 being shown in FIG. 1. As shown in FIG. 3, the control circuit module 4 has a detector 41, an informing unit 42, and a memory 43.

The detector 41 is configured to detect an output value from the stress sensor 5 having exceeded a threshold stored in the memory 43.

When the detector 41 detects an output value from the stress sensor 5 having exceeded the threshold stored in the memory 43, the informing unit 42 informs the user of the output value having exceed the threshold. Based on what is detected by the detector 41, the informing unit 42 causes the speaker 421 to emit a beeping sound or the like, thereby informing the user of the output value having exceed the threshold. A method of informing the user is not limited to emitting a beeping sound. For example, the informing unit 42 may cause a light-emitting element to emit light to inform the user.

Moreover, in another exemplary aspect, the informing unit 42 may cause a vibrator, which serves as an informing means, to vibrate.

As shown in FIG. 2, the capacitance sensor 6 is placed in the body 2. The capacitance sensor 6 is formed into a thin-walled parallelepiped shape. As indicated in FIG. 3, the capacitance sensor 6 is electrically connected to the control circuit module 4. When the user touches the cover panel 22 or carries out a similar operation, the capacitance sensor 6 detects a change in capacitance and outputs information on a touch position corresponding to a changed capacitance detected, to the control circuit module 4.

As shown in FIG. 2, the stress sensor 5 has a first PET film 51, a detecting electrode 52, a piezoelectric film 53, a reference electrode (e.g., ground electrode) 54, a second PET film 55, and a circuit (not shown). The stress sensor 5, which is sandwiched between the cover panel 22 and the display 3, is placed in the body 2. Thus, the stress sensor 5 includes the first PET film 51, the detecting electrode 52, the piezoelectric film 53, the reference electrode 54, and the second PET film 55 that are laminated together in decreasing order from the cover panel 22 side in the Z direction.

The first PET film 51 is made of polyethylene terephthalate. The first PET film 51 is formed into a rectangular, sheet-like shape in a plan view. A first main surface (e.g., surface closer to the cover panel 22 in the Z direction) of the first PET film 51 is pasted to the capacitance sensor 6, with an adhesive interposed therebetween. To a second surface (e.g., surface closer to the bottom wall 211 of the housing 21 in the Z direction) of the first PET film 51, the detecting electrode 52 is bonded by vapor deposition.

The detecting electrode 52 is made of a conductive material and is formed into a sheet-like shape. The detecting electrode 52 is pasted to the piezoelectric film 53 with an adhesive interposed therebetween. In other words, the detecting electrode 52 is disposed between the first PET film 51 and the piezoelectric film 53. The detecting electrode 52 detects charges generated by a stress having developed on the piezoelectric film 53.

The piezoelectric film 53 is a deformable film, such as a polylactic acid film. The piezoelectric film 53 is formed into a rectangular, sheet-like shape in a plan view.

Moreover, the piezoelectric film 53 is disposed such that an angle of the direction of drawing of the piezoelectric film 53 against the Y direction is 45 degrees.

The piezoelectric film 53 contains chiral polymers. It is preferable that chiral polymers be uniaxially drawn poly-lactic acid (PLA) or poly-L-lactic acid (PLLA).

A chiral polymer has a principle chain of a helical structure. Uniaxially drawing the chiral polymer to orient its molecules gives the chiral polymer piezoelectricity. Because the chiral polymer becomes piezoelectric when being subjected to a molecule orientation process, such as drawing, it does not need to be subjected to a polling process, whereas other polymers or piezoelectric ceramics, such as polyvinylidene difluoride (PVDF), must be subjected to the polling process to make them piezoelectric. The piezoelectric constant of uniaxially drawn PLLA is extremely high among the piezoelectric constants of other polymers. The piezoelectric constant of PLLA does not change depending on time passage and is extremely stable. Having no pyroelectricity, PLLA is used preferably as a material making up the device operated by users.

When the body 2 is bent around the X direction, the piezoelectric film 53 is warped in the Z direction, thus generating charges. According to the exemplary aspect, charges generated by the piezoelectric film 53 are detected by the detecting electrode 52.

The reference electrode 54 is formed into a rectangular shape in a plan view. The reference electrode 54 is bonded to the second PET film 55 by vapor deposition. The reference electrode 54 is pasted to a surface of the piezoelectric film 53 that is closer to the bottom wall 211 in the z direction, with an adhesive interposed between the reference electrode 54 and the piezoelectric film 53. In other words, the reference electrode 54 is disposed between the piezoelectric film 53 and the second PET film 55.

The second PET film 55 is made of polyethylene terephthalate. The second PET film 55 is formed into a rectangular, sheet-like shape in a plan view. A first main surface (e.g., surface closer to the cover panel 22 in the Z direction) of the second PET film 55 is pasted to the piezoelectric film 53, with the reference electrode 54 sandwiched therebetween. A second surface of the second PET film 55 is pasted to a surface of the display 3, with an adhesive interposed therebetween.

The circuit of the stress sensor 5 integrates charges detected by the detecting electrode 52 and outputs the result of the integration to the control circuit module 4.

Figure 4:
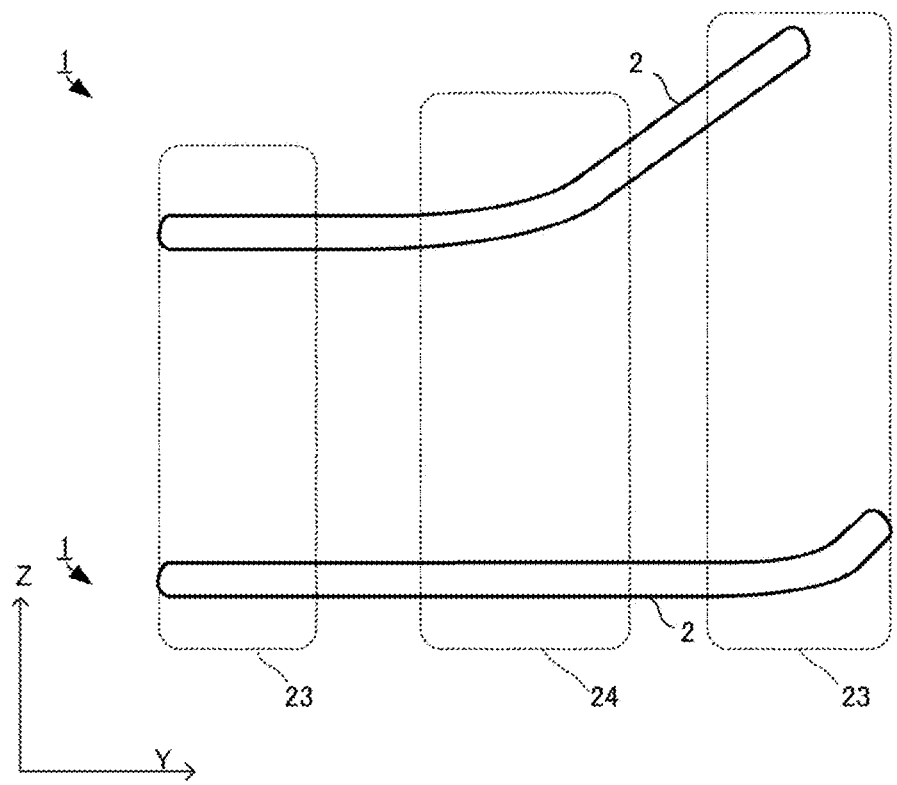
FIG. 4 shows side views of the electronic device of first embodiment, with a body of the electronic device bent around an X direction.

FIG. 4 shows side views of the electronic device 1 with the body 2 bent around the X direction. In FIG. 4, the side view on the upper side depicts the electronic device 1 with the central part 24 bent around the X direction, while the side view on the lower side depicts the electronic device 1 with the end part 23 bent around the X direction.

As shown in FIG. 4, the electronic device 1 is used on the assumption that it is bent by the user around the X direction at the central part 24 in the lengthwise direction (i.e., the Y direction) of the body 2. Thus, according to the exemplary aspect, the body 2, the display 3, and the stress sensor 5 are flexible.

However, the user may bend the body 2 around the X direction at the end part 23. At the end part 23, even if a relatively small stress develops as a result of bending the body 2 around the X direction, the body 2 and the display 3 may not be able to withstand such a small stress. Besides, the body 2 has an electronic circuit, such as the control circuit module 4, disposed on the end part 23. This poses a concern that even if a relatively small stress develops at the end part 23, the electronic circuit, such as the control circuit module 4, may make an unexpected action.

To deal with such a concern, the stress sensor 5 is improved in its sensitivity at the end part 23 so that even if a relatively small stress develops at the end part 23, the detector 41 can detect only the output value output at the end part 23 by the stress sensor 5 having exceeded the threshold. In other words, the stress sensor 5 is configured to allow the detector 41 to detect only the output value output at the end part 23 by the stress sensor 5 having exceeded the threshold, even if the end part 23 and the central part 24 are bent around the X direction at the same angle.

In the electronic device 1, the stress sensor 5 detects stresses having developed respectively at the end part 23 and the central part 24 of the body 2 in the lengthwise direction (i.e., the Y direction) perpendicular to the thickness direction (i.e., the Z direction). When the end part 23 and the central part 24 in the lengthwise direction are bent at the same radius of curvature, the stress sensor 5 outputs output values such that a first output value based on a stress having developed at the end part 23 is different from a second output value based on a stress having developed at the central part 24. The detector 41 detects at least one of the first output value or the second output value having exceeded the given threshold.

More specifically, when the end part 23 and the central part 24 are bent at the same radius of curvature, the stress sensor 5 outputs the first and second output values such that the first output value is larger than the second output value. When the detector 41 detects one of the first output value or the second output value having exceeded the threshold, the informing unit 42 informs the user of the first output value or the second output value having exceeded the threshold.

The larger the area of the electrode that detects charges generated by the piezoelectric film 53 is, the more charges the stress sensor 5 detects. In other words, the larger the area of the electrode that detects charges generated by the piezoelectric film 53 is, the higher the sensitivity of the stress sensor 5 is.

Figure 5:
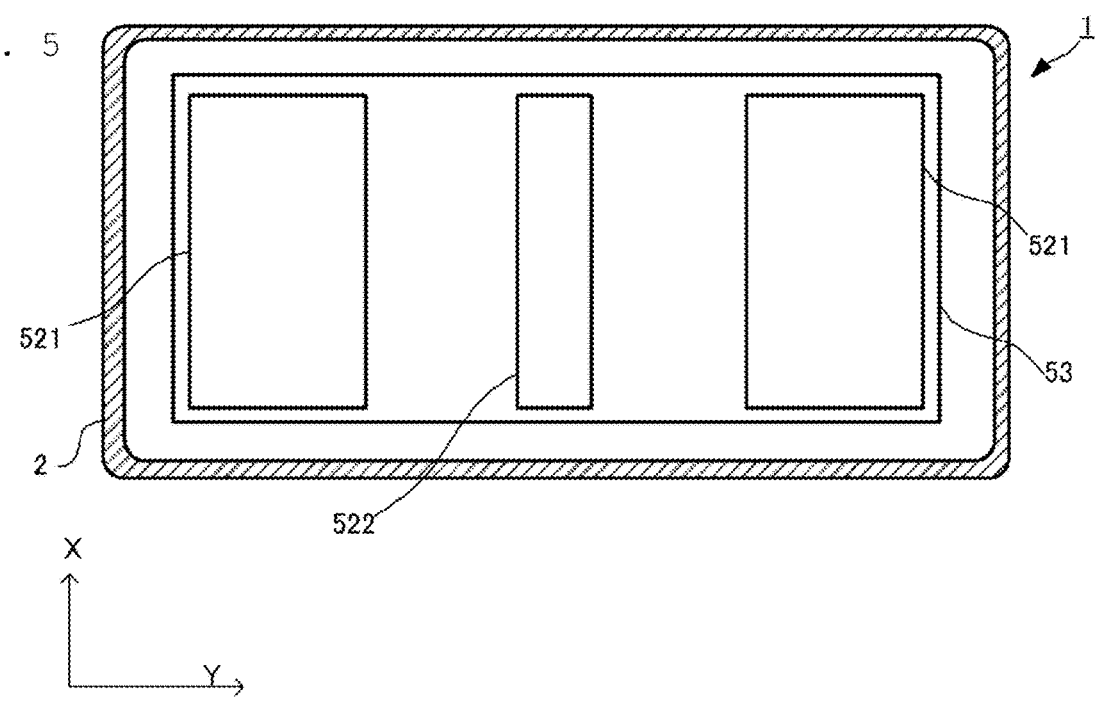
FIG. 5 is a plan view of a principle part of the electronic device of the first embodiment.

FIG. 5 is a plan view of a principle part of the electronic device 1. The detecting electrode 52 is composed of a pair of first electrodes 521 disposed respectively on a pair of the end parts 23, and a second electrode 522 disposed on the central part 24. As shown in FIG. 5, the pair of first electrodes 521 each have an area different from the area of the second electrode 522. More specifically, the area of each of the pair of first electrodes 521 is larger than the area of the second electrode 522 according to the exemplary aspect. In the Y direction, the length of each of the pair of first electrodes 521 is larger than the length of the second electrode 522. In the X direction, however, the length of each of the pair of first electrodes 521 is equal to the length of the second electrode 522 as also shown.

When the end part 23 and the central part 24 are bent at the same radius of curvature, the first electrode 521, which is larger in electrode area than the second electrode 522, detects more charges than the second electrode 522 does. As a result, when the end part 23 and the central part 24 are bent at the same radius of curvature, the first output value becomes larger than the second output value.

Figure 6:
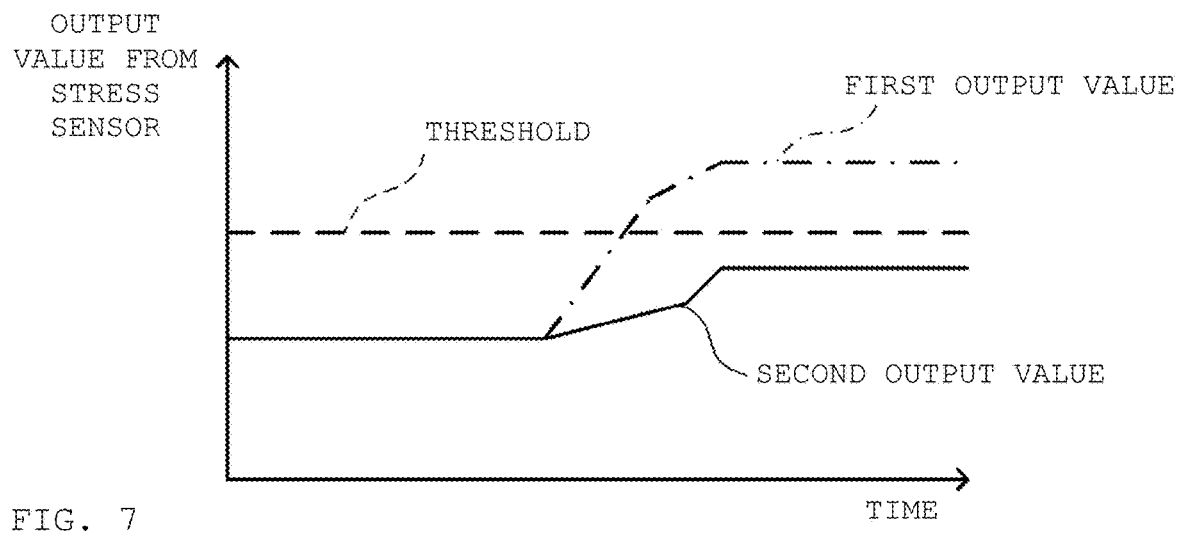
FIG. 6 is an explanatory view showing output values from the above electronic device that are plotted against time passage.

FIG. 6 is an explanatory view showing output values from the stress sensor 5 that are plotted against time passage for a case where the end part 23 and the central part 24 are bent at the same radius of curvature. In FIG. 6, a continuous line represents the second output value while a single-dot chain line represents the first output value. In FIG. 6, a broken line represents the threshold. As shown in FIG. 6, the first output value becomes larger than the second output value as time elapses.

As demonstrated in FIG. 6, when the end part 23 and the central part 24 are bent at the same radius of curvature, only the first output value exceeds the threshold in some cases. When the first output value has exceeded the threshold, the detector 41 outputs a signal to the informing unit 42.

According to the electronic device 1 of this embodiment, when the end part 23 and the central part 24 are bent at the same radius of curvature, the amount of generated charges detected at the end part 23 is greater than the amount of generated charges detected at the central part 24. Thus, when the end part 23 and the central part 24 are bent at the same radius of curvature, the first output value is larger than the second output value. Therefore, according to the electronic device 1 of this embodiment, even when the end part 23 and the central part 24 are bent at the same radius of curvature, only the first output value exceeds the threshold in some cases. The detector 41 thus detects the first output value having exceeded the threshold. In this case, the electronic device 1 can detect a bending limit of the end part 23 and a bending limit of the central part 24 through one detector 41. In other words, the electronic device 1 does not need to have a plurality of detectors arranged respectively on the first electrodes 521 and the second electrode 522. This makes it unnecessary for the electronic device 1 to save space for a circuit related to the detecting electrode 52 and carry out complicated signal processing.

It is preferable, according to the electronic device 1 of this embodiment, that each of the detecting electrode 52 and the reference electrode 54 be a transparent conductive film made of, for example, indium tin oxide (ITO) or poly-3, 4-ethylene dioxythiophene (PEDOT). When the stress sensor 5 is disposed opposite to the cover panel 22 with respect to the display 3, the detecting electrode 52 and the reference electrode 54 do not need to be transparent. It is preferable in this case that these electrodes be conductive films with high conductivity, such as a copper film or sliver film.

According to the electronic device 1 of this embodiment, to improve its durability against a bending operation, a polymer-type conductive film dispersed with metal grains or a metal meshed film may be used as the detecting electrode 52 and the reference electrode 54.

It is also preferable that the threshold be stored in advance in the memory 43 when the electronic device 1 is manufactured. It should be appreciate that the threshold may be changed by the user according to an exemplary aspect.

The threshold may be provided as a plurality of thresholds. Cases where two thresholds are used as a first threshold, which is small, and a second threshold, which is large, will be described.

In one case, the informing unit 42 causes the speaker 421 to emit a relatively small alarm sound when the first output value has exceeded the first threshold, and causes the speaker 421 to emit a larger alarm sound when the first output value has exceeded the second threshold. In another case, when the first output value has exceeded the first threshold, the informing unit 42 causes the speaker 421 to emit an alarm sound with a desired size to give a warning to the user, and when the first output value has exceeded the second threshold, the control circuit module 4 cuts off power supply to prevent a failure of the electronic device 1 caused by heat and the like.

The configuration and arrangement of the control circuit module 4 are not limited to the configuration and arrangement according to this embodiment. The piezoelectric film 53 is provided not only as the polylactic acid film but also as another form of a film.

Second Exemplary Embodiment

Figure 7:
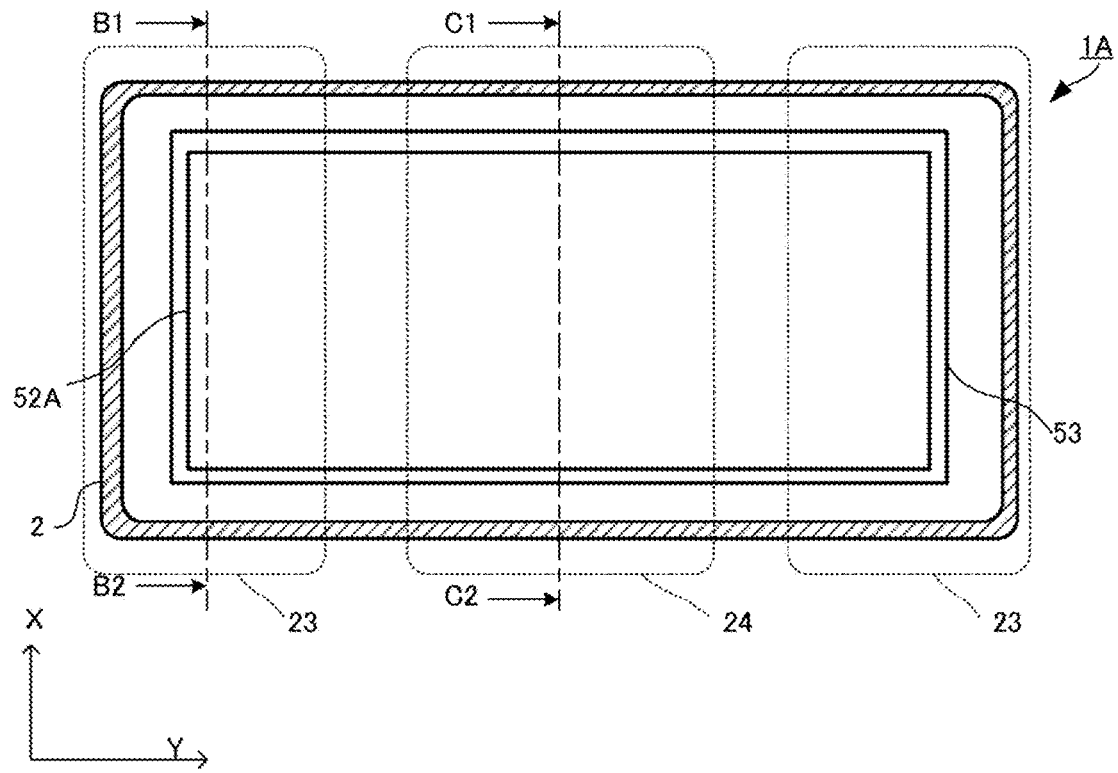
FIG. 7 is a plan view of a principle part of an electronic device according to a second embodiment.
Figure 8A:
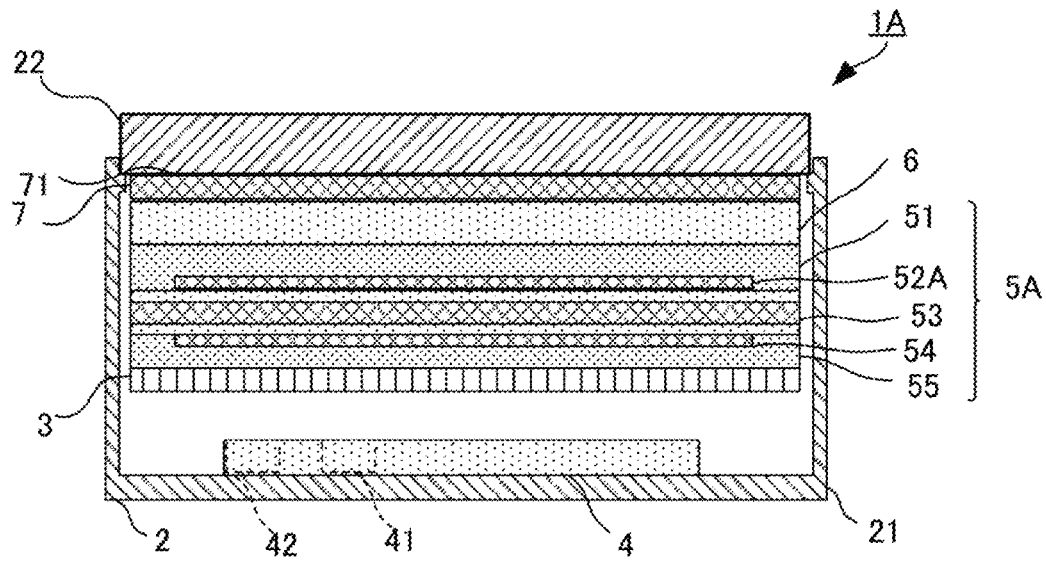
FIG. 8A is a sectional view of the electronic device of the second embodiment that is taken along a B1-B2 line.
Figure 8B:
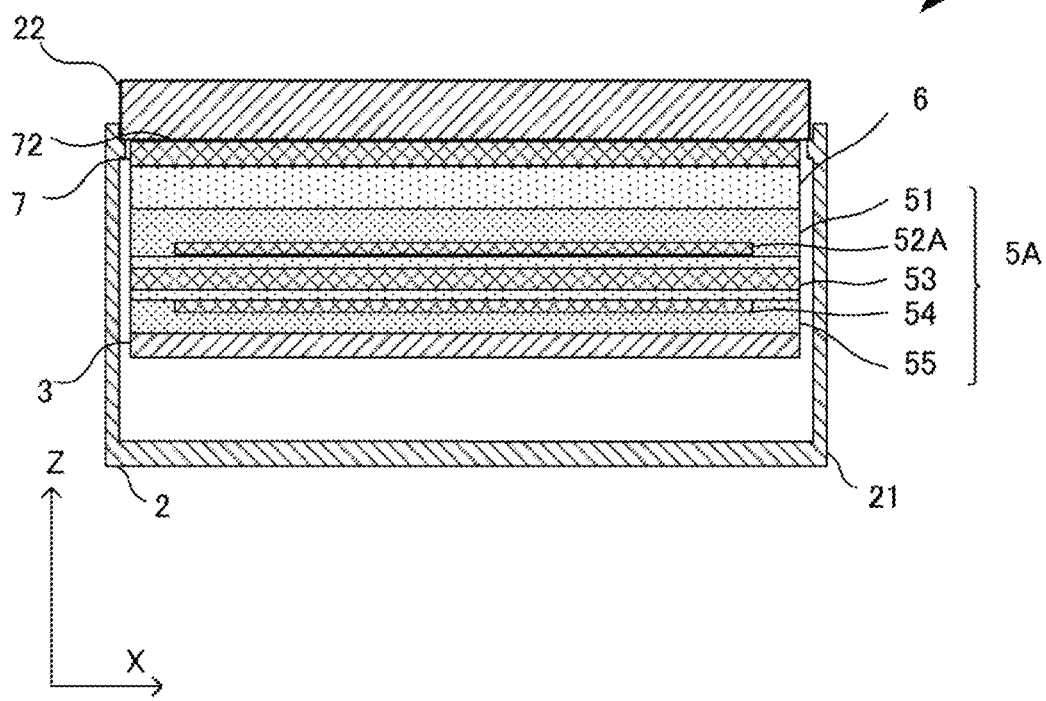
FIG. 8B is a sectional view of the electronic device of the second embodiment that is taken along a C1-C2 line.

Electronic device 1A according to a second embodiment will be described with reference to FIGS. 7, 8A, and 8B. FIG. 7 is a plan view of a principle part of the electronic device 1A. FIG. 8A is a sectional view of the electronic device 1A that is taken along an B1-B2 line. FIG. 8B is a sectional view of the electronic device 1A that is taken along an C1-C2 line.

The electronic device 1A of the second embodiment is different from the electronic device 1 of the first embodiment in that the electronic device 1A includes an adhesive layer 7. A detecting electrode 52A of the second embodiment is different from the detecting electrode 52 of the first embodiment in that the detecting electrode 52A is formed into a single sheet of an electrode. The same constituent elements as described in the first embodiment will be denoted by the same reference symbols and will not be described repeatedly for clarity purposes.

As shown in FIGS. 7, 8A and 8B, a stress sensor 5A of the electronic device 1A of this embodiment has the detecting electrode 52A formed into a rectangular, sheet-like shape of which the lengthwise direction matches the Y direction. The detecting electrode 52A is pasted to a surface (e.g., first surface) of the piezoelectric film 53 that is closer to the cover panel 22. The piezoelectric film 53 is disposed such that the direction of drawing of the piezoelectric film 53 tilts against the Y direction at 45 degrees. The detecting electrode 52A is an electrode of a planar shape.

The reference electrode 54 is pasted to a surface (e.g., second surface) of the piezoelectric film 53 that is opposite to its surface closer to the cover panel 22. The reference electrode 54 is an electrode of a planar shape.

One wiring electrode is connected to the detecting electrode 52A and to the reference electrode 54. The wiring electrode is electrically connected to the detector 41.

As shown in FIGS. 8A and 8B, the electronic device 1A includes the adhesive layer 7. The adhesive layer 7 is disposed between the cover panel 22 and the stress sensor 5A. More specifically, inside the body 2, the adhesive layer 7 is disposed between the cover panel 22 and the capacitance sensor 6. The adhesive layer 7 is formed such that the elastic modulus of a first adhesive 71 making up the adhesive layer 7 on the end part 23 is different from the elastic modulus of a second adhesive 72 making up the adhesive layer 7 on the central part 24. More specifically, the adhesive layer 7 is formed such that the elastic modulus of the first adhesive 71 is higher than the elastic modulus of the second adhesive 72.

In the electronic device 1A, the higher the elastic modulus of the adhesive of the adhesive layer 7 is, the harder alleviation (e.g., absorption) by the adhesive layer 7 of a stress developing on the piezoelectric film 53 is. For this reason, when the body 2 is bent around the X direction at the end part 23, the piezoelectric film 53 generates a greater amount of charges, which means that the sensitivity of the stress sensor 5A becomes higher. In contrast, the lower the elastic modulus of the adhesive of the adhesive layer 7 is, the easier alleviation (e.g., absorption) by the adhesive layer 7 of a stress developing on the piezoelectric film 53 is. For this reason, when the body 2 is bent around the X direction at the central part 24, the piezoelectric film 53 generates a smaller amount of charges. As a result, the sensitivity of the stress sensor 5A at the central part 24 becomes lower. Thus, when the end part 23 and the central part 24 are bent at the same radius of curvature, the first output value becomes larger than the second output value.

According to the electronic device 1A of this embodiment, the adhesive layer 7 is formed such that the elastic modulus of the first adhesive 71 is higher than the elastic modulus of the second adhesive 72. For this reason, when the end part 23 and the central part 24 are bent at the same radius of curvature, the first output value is larger than the second output value. According to the electronic device 1A of this embodiment, therefore, even when the end part 23 and the central part 24 are bent at the same radius of curvature, only the first output value exceeds the threshold in some cases. The detector 41 thus detects the first output value having exceeded the threshold. In this case, the electronic device 1A can detect the bending limit of the end part 23 and the bending limit of the central part 24 through one detector 41. The electronic device 1A, compared to the electronic device 1 of the first embodiment, includes fewer detecting electrodes. The electronic device 1A thus includes fewer wiring lines related to the detecting electrode 52A, and therefore does not need to save space for a circuit and carry out complicated signal processing.

Using a UV-curing adhesive or heat-curing adhesive as the above adhesive gives it a higher elastic modulus. It is preferable, therefore, that the first adhesive 71 be provided as a UV-curing adhesive or heat-curing adhesive to make the elastic modulus of the first adhesive 71 higher than that of the second adhesive 72. More specifically, when partially exposed to UV-rays or heat, the first adhesive 71 comes to have an elastic modulus higher than that of the second adhesive 72.

When a UV-curing or heat-curing adhesive is used as the adhesive layer 7, for example, the adhesive is applied first to the whole of the capacitance sensor 6. After the capacitance sensor 6 is coated with the adhesive, the elastic modulus of the coat of the adhesive can be adjusted externally.

According to the electronic device 1A, adhesives different in elastic modulus from each other may be used as the adhesive layer 7.

Third Exemplary Embodiment

Figure 9:
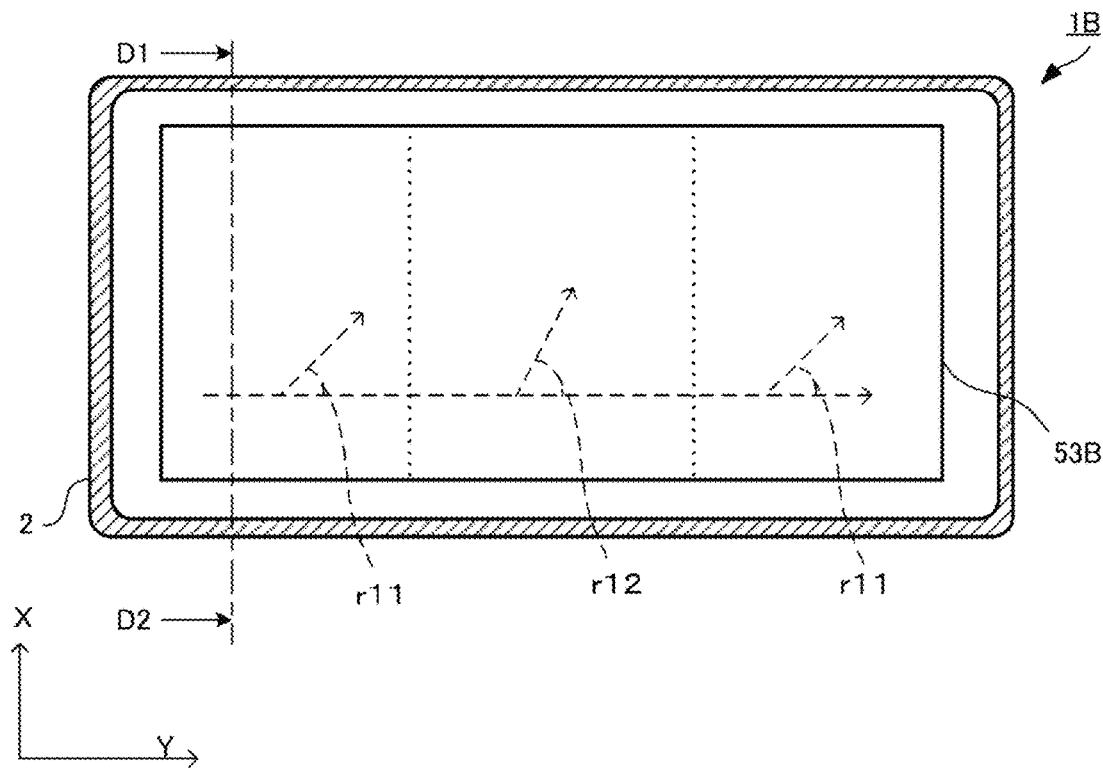
FIG. 9 is a plan view of a principle part of an electronic device according to a third embodiment.
Figure 10:
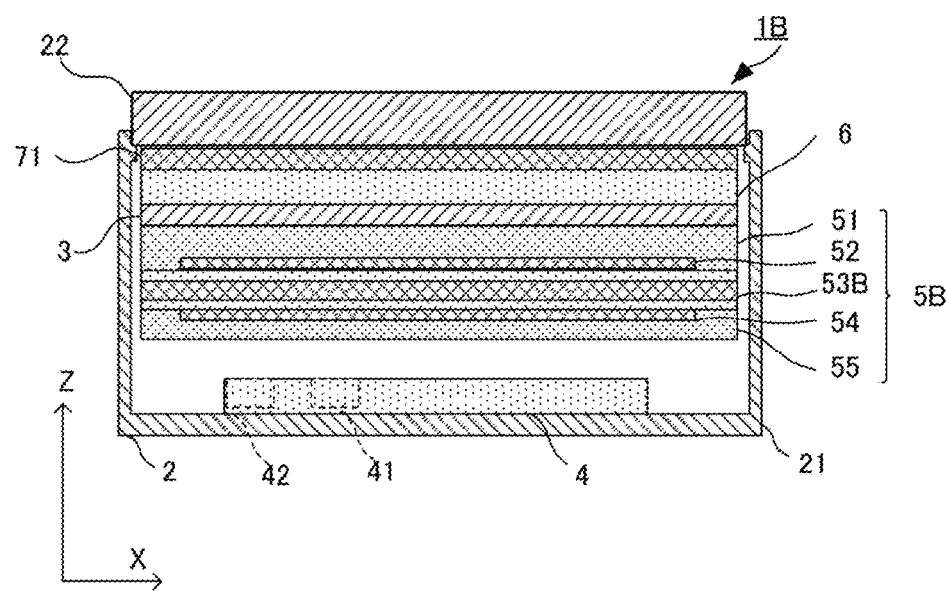
FIG. 10 is a sectional view of the above electronic device that is taken along an D1-D2 line.
Figure 11:
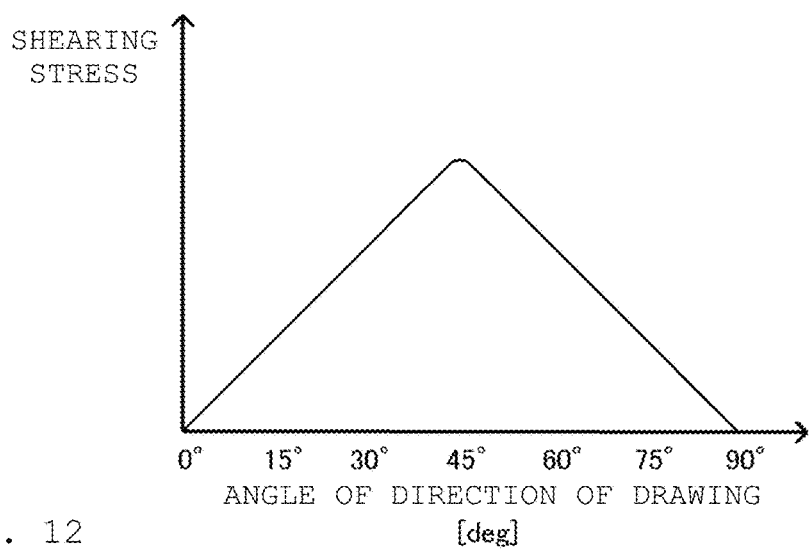
FIG. 11 is an explanatory view showing a relationship between an angle of the direction of drawing of the piezoelectric film of the third embodiment and a shearing stress.

An electronic device 1B according to a third embodiment will be described with reference to FIGS. 9, 10, and 11. FIG. 9 is a plan view of a principle part of the electronic device 1B. FIG. 10 is a sectional view of the electronic device 1B that is taken along an D1-D2 line. FIG. 11 is an explanatory view showing a relationship between each of angles r11 and r12 of the direction of drawing of a piezoelectric film 53B and a shearing stress for a case where the body 2 is bent around the X direction.

The electronic device 1B of the third embodiment is different from the electronic device 1 of the first embodiment and from the electronic device 1A of the second embodiment in that the angle r11 of the direction of drawing of the piezoelectric film 53B at the end part 23 is different from the angle r12 of the direction of drawing of the piezoelectric film 53B at the central part 24. The same constituent elements as described in the first embodiment will be denoted by the same reference symbols and will not be described repeatedly for clarity purposes.

As shown in FIG. 9, according to the electronic device 1B of the third embodiment, the piezoelectric film 53B contains polylactic acid. The piezoelectric film 53B is formed such that the angle r11 of the direction of drawing against the lengthwise direction (Y direction) of the body 2 at the end part 23 is different from the angle r12 of the direction of drawing against the lengthwise direction at the central part 24. More specifically, in the piezoelectric film 53B, the angle r11 of the direction of drawing against the Y direction at the end part 23 is closer to 45 degrees than the angle r12 of the direction of drawing at the central part 24.

The piezoelectric film 53B is formed into a rectangular, sheet-like shape of which the lengthwise direction matches the Y direction. At both end parts in the Y direction of the piezoelectric film 53B, that is, end parts overlapping respectively the end parts 23 of the body 2 in the Z direction, for example, the angle r11 of the direction of drawing against the Y direction is determined to be 45 degrees. At a central part in the Y direction of the piezoelectric film 53B, that is, a central part overlapping the central part 24 of the body 2 in the Z direction, for example, the angle r12 of the direction of drawing against the Y direction is determined to be 75 degrees.

On a surface of the piezoelectric film 53B, a shearing stress acting against the direction of drawing develops. As indicated in FIG. 11, when the piezoelectric film 53B is bent around the X direction, the shearing stress becomes the maximum when the angle of the direction of drawing of the piezoelectric film 53B is 45 degrees. In contrast, the shearing stress becomes the minimum when the angle of the direction of drawing of the piezoelectric film 53B is 0 degrees or 90 degrees. It follows, therefore, that the shearing stress developed at the part where the angle r11 of the direction of drawing of the piezoelectric film 53B is 45 degrees becomes larger than the shearing stress developed at the part where the angle r12 of the direction of drawing of the piezoelectric film 53B is 75 degrees. As a result, when the end part 23 and the central part 24 are bent at the same radius of curvature, the amount of charges generated at the end part 23 is greater than the amount of charges generated at the central part 24. For this reason, when the end part 23 and the central part 24 are bent at the same radius of curvature, the first output value is larger than the second output value.

According to the electronic device 1B of this embodiment, the angle of the direction of drawing of the piezoelectric film 53B at the end part 23 is made different from the angle of the direction of drawing of the piezoelectric film 53B at the central part 24. According to the electronic device 1B of this embodiment, therefore, even when the end part 23 and the central part 24 are bent at the same radius of curvature, only the first output value exceeds the threshold in some cases. The detector 41 thus detects the first output value having exceeded the threshold. In this case, the electronic device 1B is configured to detect the bending limit of the end part 23 and the bending limit of the central part 24 through one detector 41. This makes it unnecessary for the electronic device 1B to save space for the circuit related to the detector 41 and carry out complicated signal processing.

The electronic device 1B of this embodiment can be achieved, for example, by using a film made of poly-L-lactic acid (PLLA) as the piezoelectric film 53B.

Fourth Exemplary Embodiment

Figure 12:
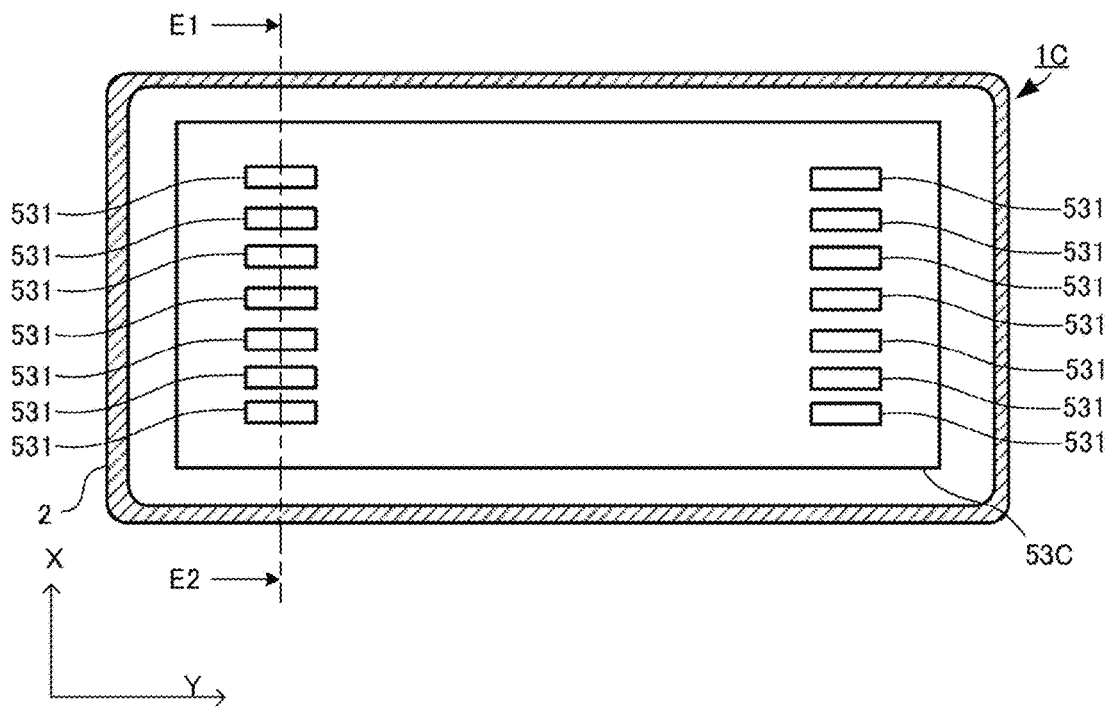
FIG. 12 is a plan view of a principle part of an electronic device according to a fourth embodiment.
Figure 13:
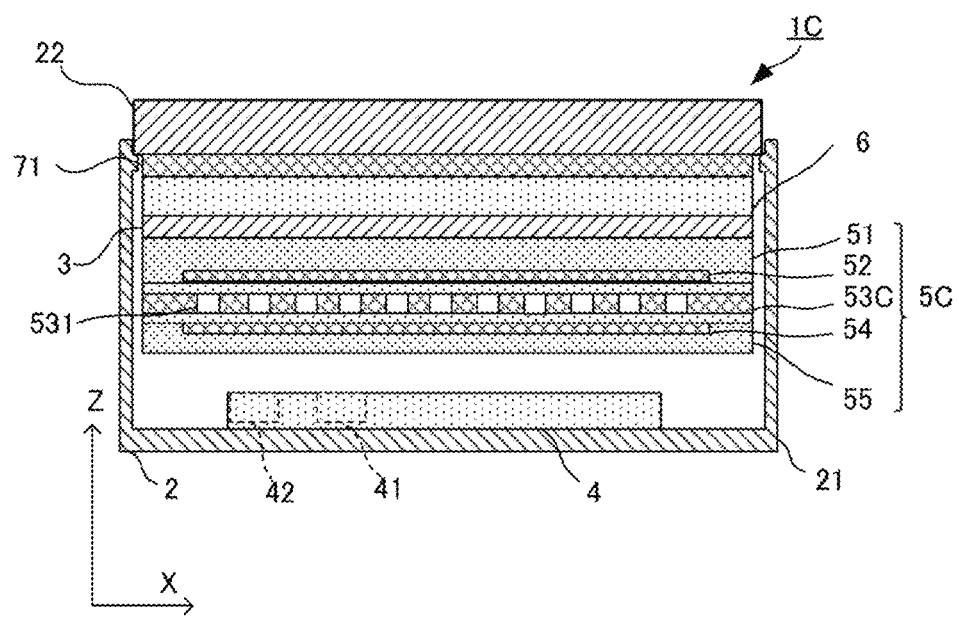
FIG. 13 is a sectional view of the above electronic device that is taken along an E1-E2 line.

An electronic device 1C according to a fourth embodiment will be described with reference to FIGS. 12 and 13. FIG. 12 is a plan view of a principle part of the electronic device 1C. FIG. 13 is a sectional view of the electronic device 1C that is taken along an E1-E2 line.

The electronic device 1C of the fourth embodiment is different from the electronic device 1 of the first embodiment, the electronic device 1A of the second embodiment, and the electronic device 1B of the third embodiment in that a plurality of slits 531 are formed on the piezoelectric film 53C. The same constituent elements as described in the first embodiment will be denoted by the same reference symbols and will not be described repeatedly for clarity purposes.

The piezoelectric film 53C has the slits 531 formed on each end part 23, where the slits 531, which are elongated in the direction parallel with the lengthwise direction (e.g., Y direction) of the body 2, are lined up in the width direction (e.g., X direction) perpendicular to the thickness direction (e.g., Z direction) of the body 2 and to the lengthwise direction (e.g., Y direction) of the same. In other words, on both ends in the Y direction of the piezoelectric film 53C, the plurality of slits 531 elongated along the Y direction are formed. The plurality of slits 531 formed on one end in the Y direction of the piezoelectric film 53C are lined up along the X direction such that the slits 531 are parallel with each other. The plurality of slits 531 formed on the other end in the Y direction of the piezoelectric film 53C are lined up along the X direction such that the slits 531 are parallel with each other.

According to the electronic device 1C of this embodiment, when the body 2 is bent around the X direction at the end part 23, a stress developing on the piezoelectric film 53C and acting in the X direction is alleviated by the plurality of slits 531. An output value from the stress sensor 5 is an output value based on a combined stress created by combining together a stress acting in the X direction and a stress acting in the Y direction. When the body 2 is bent around the X direction at the end part 23, a stress acting in the Y direction mainly develops on the body 2. Nevertheless, a stress acting in the X direction develops also. Output based on the stress acting in the X direction is reverse in polarity. At the end part 23, the quantity of displacement of the piezoelectric film 53C in the X direction becomes smaller than the quantity of displacement of the piezoelectric film 53C in the X direction at the central part 24. This means that the stress acting in the X direction, which leads to output reverse in polarity, becomes smaller at the end part 23. As a result, when the end part 23 and the central part 24 are bent at the same radius of curvature, the amount of charges generated at the end part 23 is larger than the amount of charges generated at the central part 24. For this reason, when the end part 23 and the central part 24 are bent at the same radius of curvature, the first output value is larger than the second output value. In this case, the bending limit of the end part 23 and the bending limit of the central part 24 can be detected through one detector 41. This makes it unnecessary for the electronic device 1C to save space for the circuit related to the detector 41 and carry out complicated signal processing.

According to the electronic device 1C of this embodiment, the plurality of slits 531 are formed on both ends of the piezoelectric film 53C. According to the electronic device 1C of this embodiment, therefore, even when the end part 23 and the central part 24 are bent at the same radius of curvature, only the first output value exceeds the threshold in some cases. The detector 41 thus detects the first output value having exceeded the threshold. In this manner, the electronic device 1C of this embodiment is improved to exert high reliability when being subjected to a stress.

DESCRIPTION OF REFERENCE SYMBOLS 1, 1A, 1B, 1C: electronic device
2: body
23: end part
24: central part
41: detector
42: informing unit
5: stress sensor (sensor)
52, 52A: detecting electrode (electrode)
521: first electrode
522: second electrode 53, 53B, 53C: piezoelectric film
531: slit
7: adhesive layer
71: first adhesive
72: second adhesive
r11, r12: angle of the direction of drawing

The invention claimed is:

1. An electronic device comprising:
a flexible body;
a sensor disposed in the flexible body, the sensor having a piezoelectric film that is deformed in response to a bending force of the flexible body, the sensor being configured to detect respective stresses at an end part and a central part of the flexible body in a lengthwise direction perpendicular to a thickness direction of the body and, when the end part and the central part are bent at a same radius of curvature, to generate a first output value based on the detected stress at the end part that is different from a second output value based on the detected stress at the central part; and
a detector configured to detect when at least one of the first and second output values exceeds a predetermined threshold.

2. The electronic device according to claim 1, wherein the sensor is further configured to generate the first and second output values such that the first output value is larger than the second output value when the end part and the central part are bent at the same radius of curvature.

3. The electronic device according to claim 1,
wherein the sensor includes an electrode disposed on a surface of the piezoelectric film,
wherein the electrode includes a first electrode disposed on the end part and a second electrode disposed on the central part, and
wherein a surface area of the first electrode in a plan view thereof is different from a surface area of the second electrode in the plan view thereof.

4. The electronic device according to claim 1, further comprising:
an adhesive layer,
wherein the flexible body includes a cover that covers the sensor and the adhesive layer is disposed between the sensor and the cover.

5. The electronic device according to claim 4, wherein a first adhesive forming the adhesive layer on the end part has an elastic modulus that is different from an elastic modulus of a second adhesive forming the adhesive layer on the central part.

6. The electronic device according to claim 1, wherein the piezoelectric film comprises a polylactic acid and is formed such that an angle of a direction of drawing of the piezoelectric film against the lengthwise direction of the flexible body at the end part is different from an angle of the direction of drawing of the piezoelectric film against the lengthwise direction of the body at the central part.

7. The electronic device according to claim 1, wherein the piezoelectric film comprises a plurality of slits elongated in a direction parallel with the lengthwise direction of the flexible body.

8. The electronic device according to claim 7, wherein the plurality of the slits are disposed on the end part such that the plurality of slits line up in a widthwise direction perpendicular to the thickness and lengthwise directions of the flexible body.

9. The electronic device according to claim 1, further comprising an informing unit configured to provide a notification when the detector detects one of the first and second output values has exceeded the predetermined threshold.

10. The electronic device according to claim 9, further comprising:
a control unit configured to control the detector,
wherein the predetermined threshold comprises a plurality of thresholds,
wherein the plurality of thresholds include a first threshold and a second threshold higher than the first threshold, and
wherein, when the detector detects that the first output value has exceeded the first threshold, the control unit causes the informing unit to provide the notification that the first output value has exceeded the first threshold, and when the detector detects that the first output value has exceeded the second threshold, the control unit is configured to cut off a power supply to the flexible body.

11. The electronic device according to claim 1, wherein the sensor has a detecting electrode with a planar shape that is disposed on a first surface of the piezoelectric film, and a reference electrode with a planar shape that is disposed on a second surface of the piezoelectric film that opposes the first surface.

12. The electronic device according to claim 11, wherein a first wiring electrode is connected to the detecting electrode and to the reference electrode and is electrically connected to the detector.

13. An electronic device comprising:
a flexible body having a rectangular shape;
a sensor disposed in the flexible body and including a piezoelectric film configured to deform in response to a bending force applied to the flexible body;
a detector configured to detect when at least one of first and second stress values generated by the sensor exceeds a predetermined threshold; and
an informing unit configured to provide a notification when the detector detects either of the first and second stress values has exceeded the predetermined threshold,
wherein the sensor generates the first stress value based on a detected stress at an end of the flexible body in a lengthwise direction thereof,
wherein the sensor generates the second stress value based on a detected stress at a center of the flexible body relative to the end of the flexible body, and
wherein the sensor is configured to generate the first stress value to be different than the second stress value when the end of the flexible body is bent at a same radius of curvature as the center of the flexible body.

14. The electronic device according to claim 13, wherein the sensor is further configured to generate the first and second stress values such that the first stress value is larger than the second stress value when the end and the center are bent at the same radius of curvature.

15. The electronic device according to claim 13,
wherein the sensor includes a plurality of electrodes disposed on a surface of the piezoelectric film,
wherein the plurality of electrodes includes a first electrode disposed on the end and a second electrode disposed on the center of the flexible body, and
wherein a surface area of the first electrode in a plan view thereof is different from a surface area of the second electrode in the plan view thereof.

16. The electronic device according to claim 13, further comprising:
an adhesive layer,
wherein the flexible body includes a cover that covers the sensor and the adhesive layer is disposed between the sensor and the cover, and
wherein a first adhesive forming the adhesive layer on the end has an elastic modulus that is different from an elastic modulus of a second adhesive forming the adhesive layer on the center of the flexible body.

17. The electronic device according to claim 13, wherein the piezoelectric film comprises a polylactic acid and is formed such that an angle of a direction of drawing of the piezoelectric film against the lengthwise direction of the flexible body at the end is different from an angle of the direction of drawing of the piezoelectric film against the lengthwise direction of the body at the center of the flexible body.

18. The electronic device according to claim 13,
wherein the piezoelectric film comprises a plurality of slits elongated in a direction parallel with the lengthwise direction of the flexible body, and
wherein the plurality of slits are disposed on the end of the flexible body, such that the plurality of slits line up in a widthwise direction perpendicular to the lengthwise direction of the flexible body.

19. The electronic device according to claim 13, further comprising:
a control unit configured to control the detector,
wherein the predetermined threshold comprises a plurality of thresholds that include a first threshold and a second threshold higher than the first threshold, and
wherein, when the detector detects that the first stress value has exceeded the first threshold, the control unit causes the informing unit to provide the notification that the first stress value has exceeded the first threshold, and when the detector detects that the first stress value has exceeded the second threshold, the control unit is configured to cut off a power supply to the flexible body.

20. The electronic device according to claim 13,
wherein the sensor has a detecting electrode with a planar shape that is disposed on a first surface of the piezoelectric film, and a reference electrode with a planar shape that is disposed on a second surface of the piezoelectric film that opposes the first surface, and
wherein a first wiring electrode is connected to the detecting electrode and to the reference electrode and is electrically connected to the detector.

\* \* \* \* \*